(12) United States Patent
Kitagawa (10) Patent No.: US 8,698,535 B2
(45) Date of Patent: Apr. 15, 2014

(54) SEMICONDUCTOR DEVICE HAVING DELAY LINE

(76) Inventor: Katsuhiro Kitagawa, Tokyo (JP)

(*) Notice: Subject to any disclaimer, the term of this patent is extended or adjusted under 35 U.S.C. 154(b) by 0 days.

(21) Appl. No.: 13/585,110

(22) Filed: Aug. 14, 2012

(65) Prior Publication Data

US 2013/0043919 A1 Feb. 21, 2013

(30) Foreign Application Priority Data

Aug. 16, 2011 (JP) ................................. 2011-177803

(51) Int. Cl.
*H03H 11/26* (2006.01)

(52) U.S. Cl.
USPC ......................................................... 327/263

(58) Field of Classification Search
USPC ......................................................... 327/263
See application file for complete search history.

(56) References Cited

U.S. PATENT DOCUMENTS

| | | | | |
|---|---|---|---|---|
| 4,119,916 A | * | 10/1978 | Berke | ........................... 327/160 |
| 5,955,905 A | | 9/1999 | Idei et al. | |
| 6,128,248 A | | 10/2000 | Idei et al. | |
| 7,839,191 B2 | | 11/2010 | Takai | |

FOREIGN PATENT DOCUMENTS

| | | |
|---|---|---|
| JP | 62-299113 A | 12/1987 |
| JP | 10-144074 A | 5/1998 |
| JP | 2009-284266 A | 12/2009 |

* cited by examiner

*Primary Examiner* — Daniel Rojas
(74) *Attorney, Agent, or Firm* — Foley & Lardner LLP (57) ABSTRACT

Disclosed herein is a device that includes a plurality of one-shot pulse generation circuits connected in series between an input node and an output node. Each of the one-shot pulse generation circuits receives an input clock signal supplied from previously connected one-shot pulse generation circuit to output an output clock signal to subsequently connected one-shot pulse generation circuit. Both of a rising edge and a falling edge of the output clock signal are controlled based on one of a rising edge and a falling edge of the input clock signal. A time period from one of the rising edge and the falling edge of the output clock signal to the other of the rising edge and the falling edge of the output clock signal being variable.

5 Claims, 9 Drawing Sheets

SEMICONDUCTOR DEVICE HAVING DELAY LINE

This application claims priority to Japanese Application No. 2011-177803, filed Aug. 16, 2011, the disclosure of which is hereby incorporated by reference in its entirety.

BACKGROUND OF THE INVENTION

1. Field of the Invention

The present invention relates to a semiconductor device, and more particularly relates to a semiconductor device including a delay line.

2. Description of Related Art

In a semiconductor device that operates in synchronism with a clock signal such as a synchronous DRAM (Dynamic Random Access Memory), an internal clock signal that is phase-controlled is required in some cases. The phase-controlled internal clock signal is generated mainly by a DLL (Delay Locked Loop) circuit (see Japanese Patent Application Laid-open No. 2009-284266). The DLL circuit includes a delay line that delays an internal clock signal and its amount of delay is specified by a count value output from a counter circuit.

In the DLL circuit described in Japanese Patent Application Laid-open No. 2009-284266, a coarse-adjustment delay circuit having a coarse adjustment pitch of adjusting the delay amount and a fine-adjustment delay circuit having a fine adjustment pitch of adjusting the delay amount are connected in series. The DLL circuit can thereby make a fine adjustment of the delay amount while securing a sufficiently wide adjustment range of the delay amount. Although not related to the DLL circuit, Japanese Patent Application Laid-open Nos. H10-144074 and S62-299113 disclose a one-shot pulse generation circuit.

However, an ordinary fine-adjustment delay circuit requires a voltage generation circuit for generating an analog voltage because the fine-adjustment delay circuit is an interpolator circuit that uses the analog voltage. Furthermore, the ordinary fine-adjustment delay circuit is unable to obtain a desired delay amount without sufficiently ensuring the stability of the analog voltage because the delay amount changes according to unintended variations in the analog voltage. These problems occur not only to the delay line used in the DLL circuit but also to all delay lines for which it is necessary to highly accurately control the delay amount of clock signals.

SUMMARY

In one embodiment, there is provided a semiconductor device that includes: an input node; an output node; and a plurality of one-shot pulse generation circuits connected in series between the input node and the output node. Each of the one-shot pulse generation circuits receives an input clock signal supplied from the input node or another one of the one-shot pulse generation circuits previously connected thereto to output an output clock signal to the output node or another one of the one-shot pulse generation circuits subsequently connected thereto. Both of a rising edge and a falling edge of the output clock signal being controlled based on one of a rising edge and a falling edge of the input clock signal, and a time period from one of the rising edge and the falling edge of the output clock signal to the other of the rising edge and the falling edge of the output clock signal being variable.

In another embodiment, there is provided a semiconductor device that includes: a delay line delaying a first internal clock signal to generate a second internal clock signal; a replica circuit that generates a replica clock signal based on the second internal clock signal; a phase determination circuit that generates a phase determination signal based on phases of the first internal clock signal and the replica clock signal; and a counter circuit that updates a count value thereof based on the phase determination signal. The delay line includes a plurality of one-shot pulse generation circuits connected in series, and the count value defines a pulse width of a one-shot pulse generated by each of the one-shot pulse generation circuits.

BRIEF DESCRIPTION OF THE DRAWINGS

FIGS. 7A and 7B are timing diagrams for explaining an operation performed by the delay line 110, where FIG. 7A shows a case of setting the delay amount to a minimum value, and FIG. 7B shows a case of setting the delay amount to a maximum value;

DETAILED DESCRIPTION OF THE EMBODIMENTS

Preferred embodiments of the present invention will be explained below in detail with reference to the accompanying drawings.

Figure 1:
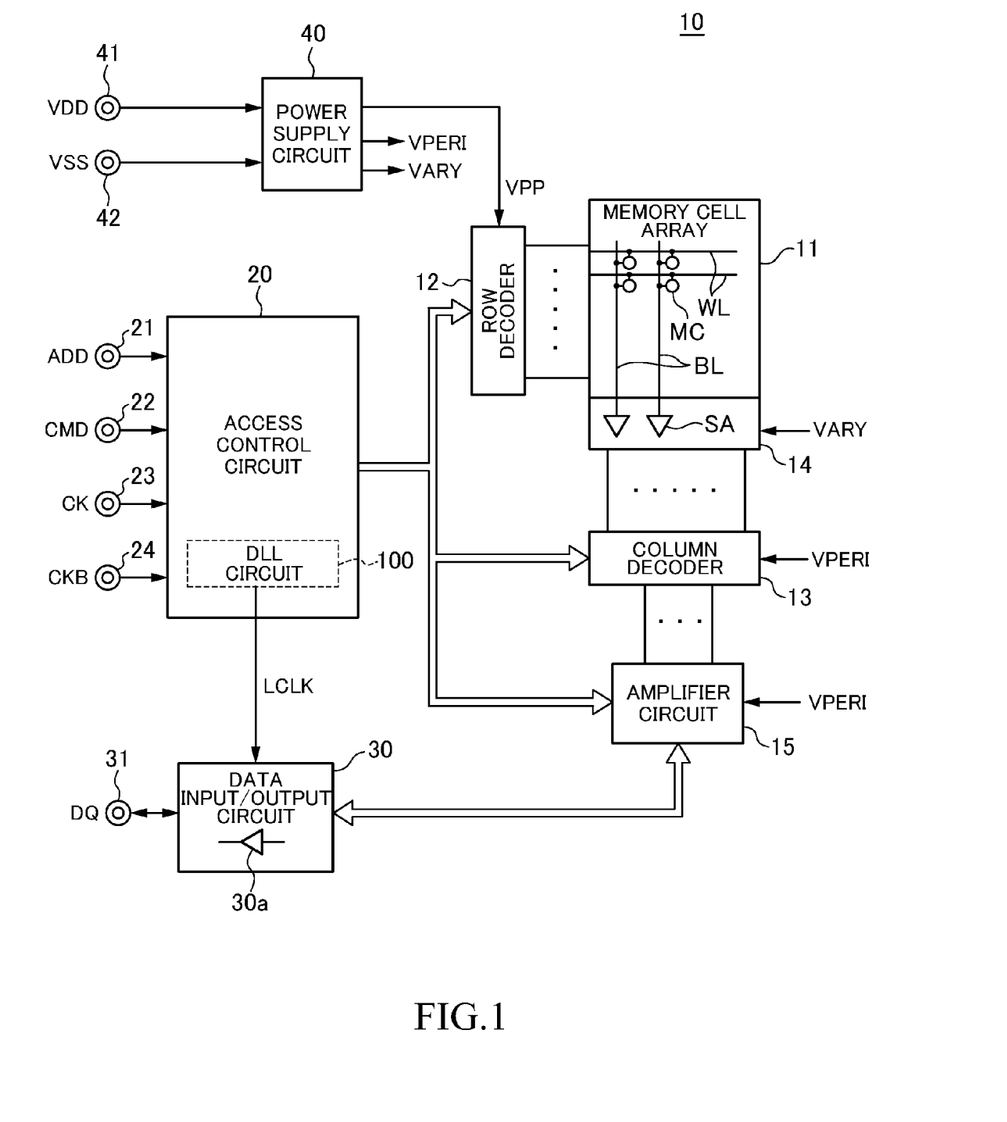
FIG. 1 is a block diagram indicative of an embodiment of a general configuration of a semiconductor device 10 according to a preferred embodiment of the present invention.

Referring now to FIG. 1, the semiconductor device 10 according to the present embodiment is a DRAM and includes the memory cell array 11. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA.

Operations of the row decoder 12, the column decoder 13, the sense circuit 14, and the amplifier circuit 15 are controlled by an access control circuit 20. An address signal ADD, a command signal CMD, external clock signals CK and CKB, a clock enable signal CKE, and the like are supplied to the access control circuit 20 through terminals 21 to 24. The external clock signals CK and CKB are signals complementary to each other. The access control circuit 20 controls the row decoder 12, the column decoder 13, the sense circuit 14, the amplifier circuit 15, and a data input/output circuit 30 based on these signals.

Specifically, when the command signal CMD indicates the active command ACT, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing.

On the other hand, when the command signal CMD indicates the read command RD or the write command WT, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit 15 and the sense amplifier SA.

As shown in FIG. 1, the access control circuit 20 includes a DLL circuit 100. The DLL circuit 100 generates an internal clock signal LCLK that is phase-controlled based on the external clock signals CK and CKB. The internal clock signal LCLK is supplied to an output buffer circuit 30a included in the data input/output circuit 30. The read data read from the memory cell array 11 is output from the data terminal 31 in synchronism with the internal clock signal LCLK.

Each of the foregoing circuit blocks uses a predetermined internal voltage as its operating power supply. Such internal power supplies are generated by a power supply circuit 40 shown in FIG. 1. The power supply circuit 40 receives an external potential VDD and a ground potential VSS that are supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is mainly used in the row decoder 12. The row decoder 12 drives a word line WL selected based on the address signal ADD to the VPP level, thereby making the cell transistors included in the memory cells MC conductive. The internal voltage VARY is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. Using the internal voltage VPERI lower than the external voltage VDD as the operating voltage of the peripheral circuits reduces power consumption of the semiconductor device 10.

Figure 2:
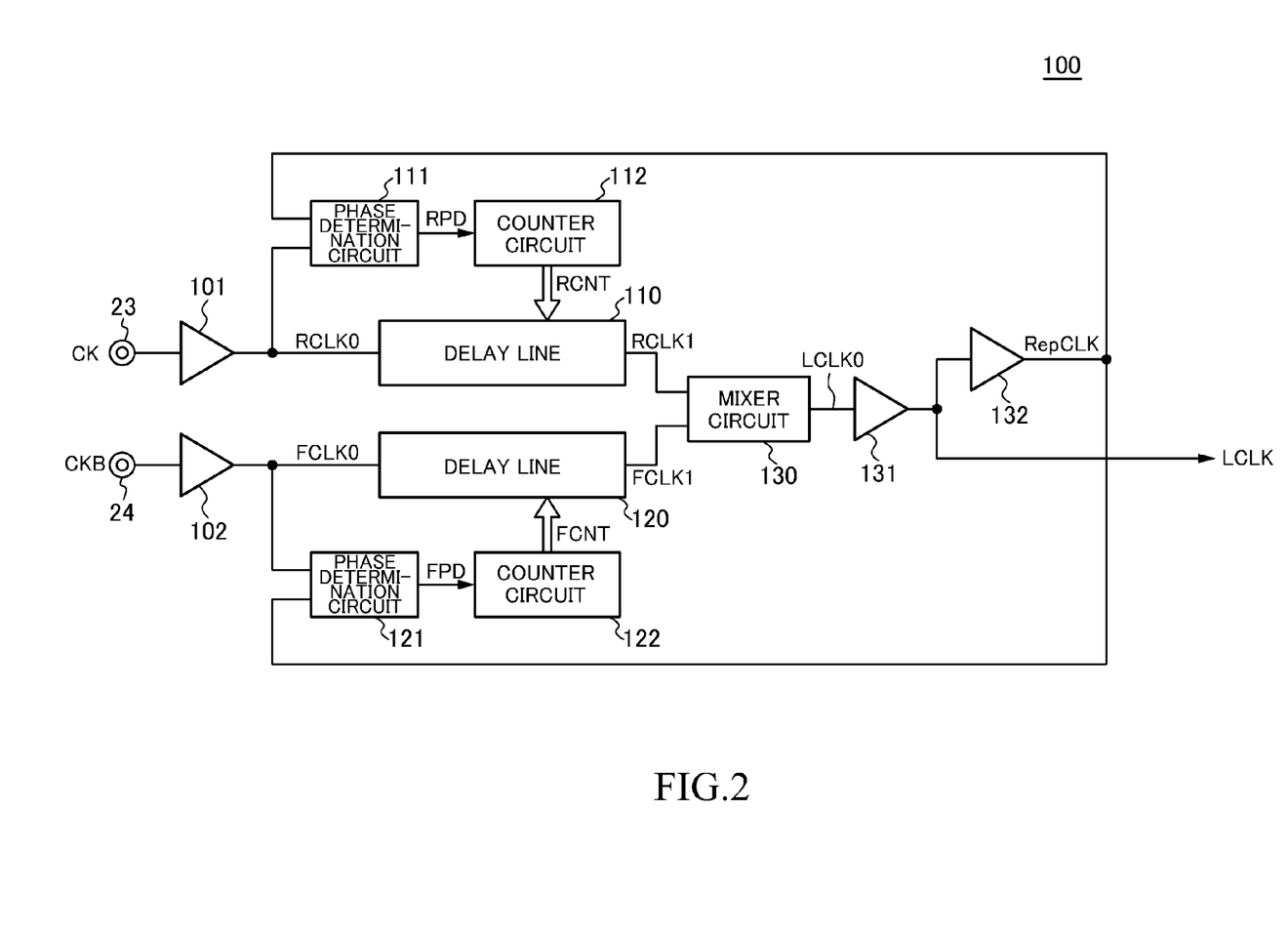
FIG. 2 is a block diagram indicative of an embodiment of a configuration of the DLL circuit 100 shown in FIG. 1.

Turning to FIG. 2, the DLL circuit 100 is a so-called two-phase DLL circuit that includes two delay lines 110 and 120. Among the delay lines 110 and 120, the delay line 110 is a circuit that generates an internal clock signal RCLK1 by delaying an internal clock signal RCLK0, and a delay amount of the delay line 110 is determined by a count value RCNT of a counter circuit 112. In the present invention, the internal clock signal RCLK0 is often referred to as "first internal clock signal" Similarly, the delay line 120 is a circuit that generates an internal clock signal FCLK1 by delaying an internal clock signal FCLK0, and a delay amount of the delay line 120 is determined by a count value FCNT of a counter circuit 122.

The internal clock signal RCLK0 is a signal that is generated by buffering the external clock signal CK supplied to the terminal 23 by a first-stage input circuit 101, and is used to monitor rising edges of the external clock signal CK (falling edges of the external clock signal CKB). On the other hand, the internal clock signal FCLK0 is a signal that is generated by buffering the external clock signal CKB supplied to the terminal 24 by a first-stage input circuit 102, and is used to monitor falling edges of the external clock signal CK (rising edges of the external clock signal CKB).

The internal clock signals RCLK1 and FCLK1 output from the delay lines 110 and 120, respectively are supplied to a mixer circuit 130. The mixer circuit 130 is a circuit that generates an internal clock signal LCLK0 by combining the internal clock signals RCLK1 and FCLK1. In the present invention, the internal clock signal LCLK0 is often referred to as "second internal clock signal".

Rising edges of the internal clock signal LCLK0 match those of the internal clock signal RCLK1, and falling edges of the internal clock signal LCLK0 match rising edges of the internal clock signal FCLK1. The internal clock signal LCLK0 generated as described above is output as the internal clock signal LCLK via a buffer circuit 131. As described above, the internal clock signal LCLK is supplied to the output buffer 30a shown in FIG. 1 and used as a signal that specifies an output timing of the read data DQ.

The internal clock signal LCLK is also supplied to a replica circuit 132. The replica circuit 132 is a circuit that is substantially identical in characteristics to the output buffer circuit 30a, and an output from the replica circuit 132 is used as a replica clock signal RepCLK. Because the output buffer circuit 30a outputs the read data DQ synchronously with the internal clock signal LCLK, the replica clock signal RepCLK output from the replica circuit 132 is accurately synchronized with the read data DQ. In the DRAM, the read data DQ needs to be accurately synchronized with the external clock signals CK and CKB, and when there is phase shifting between the read data DQ and the external clock signals CK and CKB, it is necessary to detect the phase shifting and correct it. Phase determination circuits 111 and 121 detect whether the read data DQ shifts in phase from the external clock signals CK and CKB and output determination results as phase determination signals RPD and FPD, respectively. The phase determination signals RPD and FPD are fed back to the counter circuits 112 and 122, respectively, thereby correcting the phase shifting. The phase determination circuits 111 and 121 may be referred to as a phase detector.

The phase determination circuit 111 is a circuit that compares a phase of the internal clock signal RCLK0 with that of the replica clock signal RepCLK, and that generates the phase determination signal RPD based on a result of comparison. The internal clock signal RCLK0 is a signal having rising edges that match in timing the rising edges of the external clock signal CK (falling edges of the external clock signal CKB), and the replica clock signal RepCLK is a signal that matches in timing the read data DQ. Therefore, this follows that the phase determination circuit 111 indirectly compares the rising edges of the external clock signal CK with the phase of the read data DQ.

When the result of the comparison indicates that the replica clock signal RepCLK is delayed from the internal clock signal RCLK0 in phase, the phase determination circuit 111 sets the phase determination signal RPD to one logical level (a low level, for example). In response to this phase determination signal RPD, the counter circuit 112 counts down and the delay amount of the delay line 110 thereby decreases. Conversely, when the result of the comparison indicates that the replica clock signal RepCLK leads the internal clock signal RCLK0 in phase, the phase determination circuit 111 sets the phase determination signal RPD to the other logical level (a high level, for example). In response to this phase determination signal RPD, the counter circuit 112 counts up and the delay amount of the delay line 110 thereby increases. If the phase of the internal clock signal RCLK0 matches that of the replica clock signal RepCLK by repeating such an operation cyclically, the phase of the read data DQ eventually matches the rising edges of the external clock signal CK.

Similarly, the phase determination circuit 121 is a circuit that compares a phase of the internal clock signal FCLK0 with that of the replica clock signal RepCLK, and that generates the phase determination signal FPD based on a result of comparison. The internal clock signal FCLK0 is a signal having rising edges that match in timing the falling edges of the external clock signal CK (rising edges of the external clock signal CKB), and the replica clock signal RepCLK is the signal that matches in timing the read data DQ. Therefore, this follows that the phase determination circuit 121 indirectly compares the falling edges of the external clock signal CK with the phase of the read data DQ.

When the result of the comparison indicates that the replica clock signal RepCLK is delayed from the internal clock signal FCLK0 in phase, the phase determination circuit 121 sets the phase determination signal FPD to one logical level (a low level, for example). In response to this phase determination signal FPD, the counter circuit 122 counts down and the delay amount of the delay line 120 thereby decreases. Conversely, when the result of the comparison indicates that the replica clock signal RepCLK leads the internal clock signal FCLK0 in phase, the phase determination circuit 121 sets the phase determination signal FPD to the other logical level (a high level, for example). In response to this phase determination signal FPD, the counter circuit 122 counts up and the delay amount of the delay line 120 thereby increases. If the phase of the internal clock signal FCLK0 matches that of the replica clock signal RepCLK by repeating such an operation cyclically, the phase of the read data DQ eventually matches the falling edges of the external clock signal CK.

Figure 3:
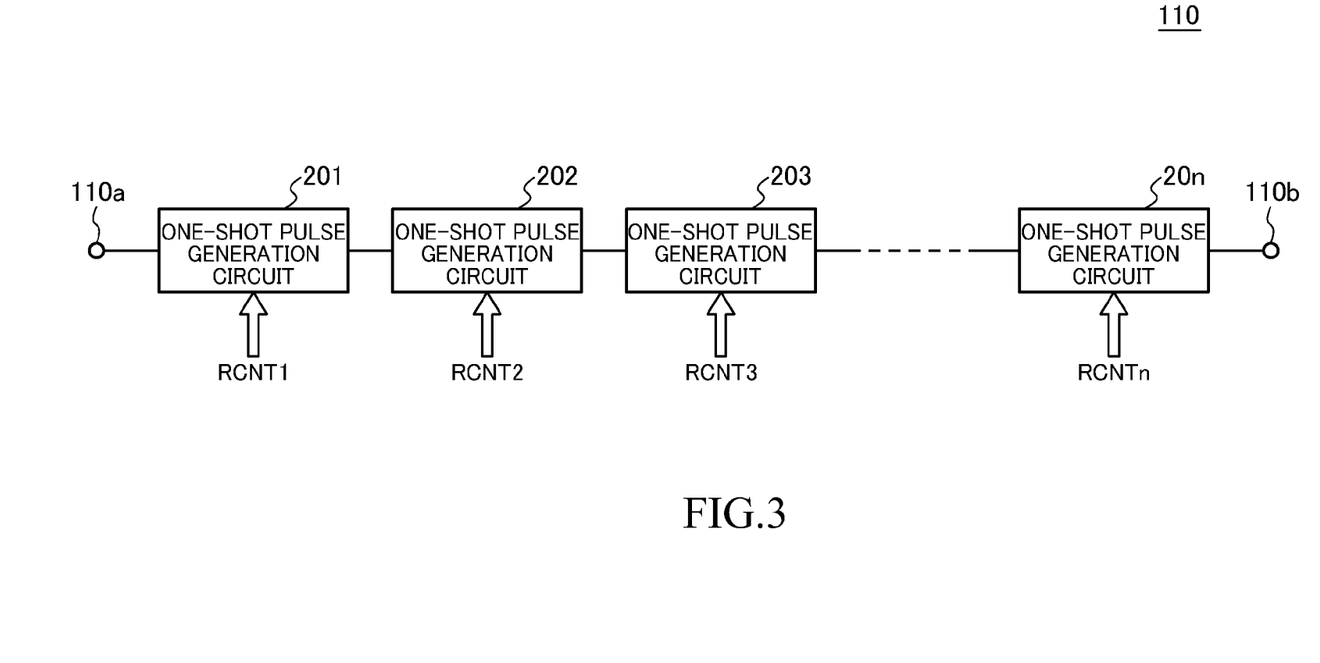
FIG. 3 is a block diagram indicative of an embodiment of a configuration of the delay line 110 shown in FIG. 2.

Turning to FIG. 3, the delay line 110 is configured to include n one-shot pulse generation circuits 201 to 20n connected in series between an input node 110a and an output node 110b. The input node 110a is a node to which the internal clock signal RCLK0 is supplied, and the output node 110b is a node from which the internal clock signal RCLK1 is output. Corresponding count values RCNT1 to RCNTn are supplied to the one-shot pulse generation circuits 201 to 20n, and the count values RCNT1 to RCNTn control pulse widths of one-shot pulses generated by the one-shot pulse generation circuits 201 to 20n, respectively. Although not shown, the delay line 120 is identical in configuration to the delay line 110. That is, n one-shot pulse generation circuits are connected in series, and corresponding count values FCNT1 to FCNTn control pulse widths of one-shot pulses generated by the n one-shot pulse generation, respectively.

Figure 4:
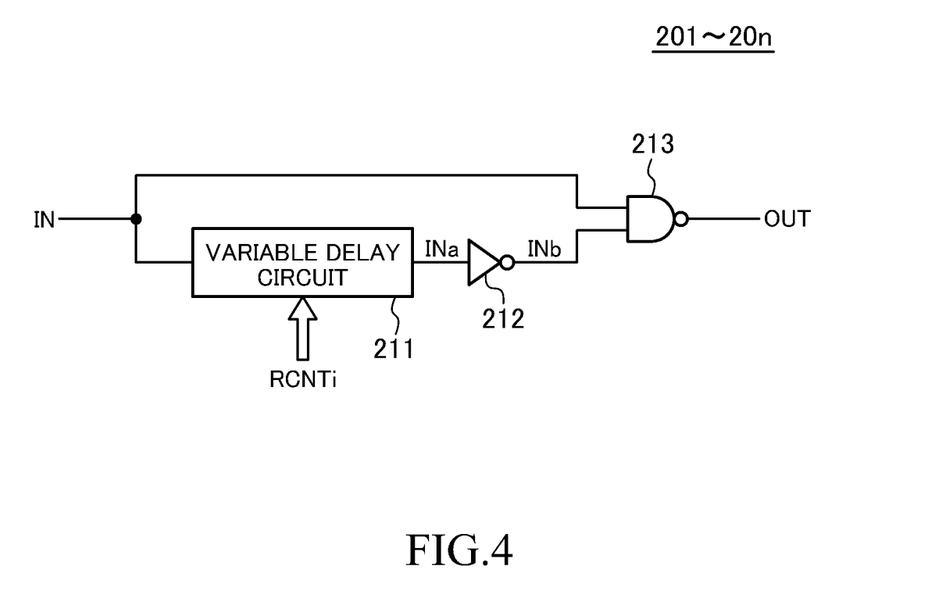
FIG. 4 is a circuit diagram indicative of an embodiment of one-shot pulse generation circuits 201 to 20n shown in FIG. 3.

Turning to FIG. 4, each of the one-shot pulse generation circuits 201 to 20n is configured to include a variable delay circuit 211 that generates a clock signal INa by delaying an input clock signal IN, an inverter 212 that generates a clock signal INb by inverting the clock signal INa, and a NAND gate circuit 213 that receives the input clock signal IN and the clock signal INb and that generates an output clock signal OUT. The input clock signal IN corresponds to the internal clock signal RCLK0 when the one-shot pulse generation circuit is the first-stage one-shot pulse generation circuit 201, and corresponds to the output clock signal OUT from one of the previous-stage one-shot pulse generation circuits 201 to 20(n−1) when the one-shot pulse generation circuit is one of the second-stage and following one-shot pulse generation circuits 202 to 20n. Furthermore, the output clock signal OUT corresponds to the internal clock signal RCLK1 when the one-shot pulse generation circuit is the final-stage one-shot pulse generation circuit 20n, and corresponds to the input clock signal IN supplied to one of the rear-stage one-shot pulse generation circuits 202 to 20n when the one-shot pulse generation circuit is one of the one-shot pulse generation circuits 201 to 20(n−1) previous to the final-stage one-shot pulse generation circuit 20n.

Figure 5:
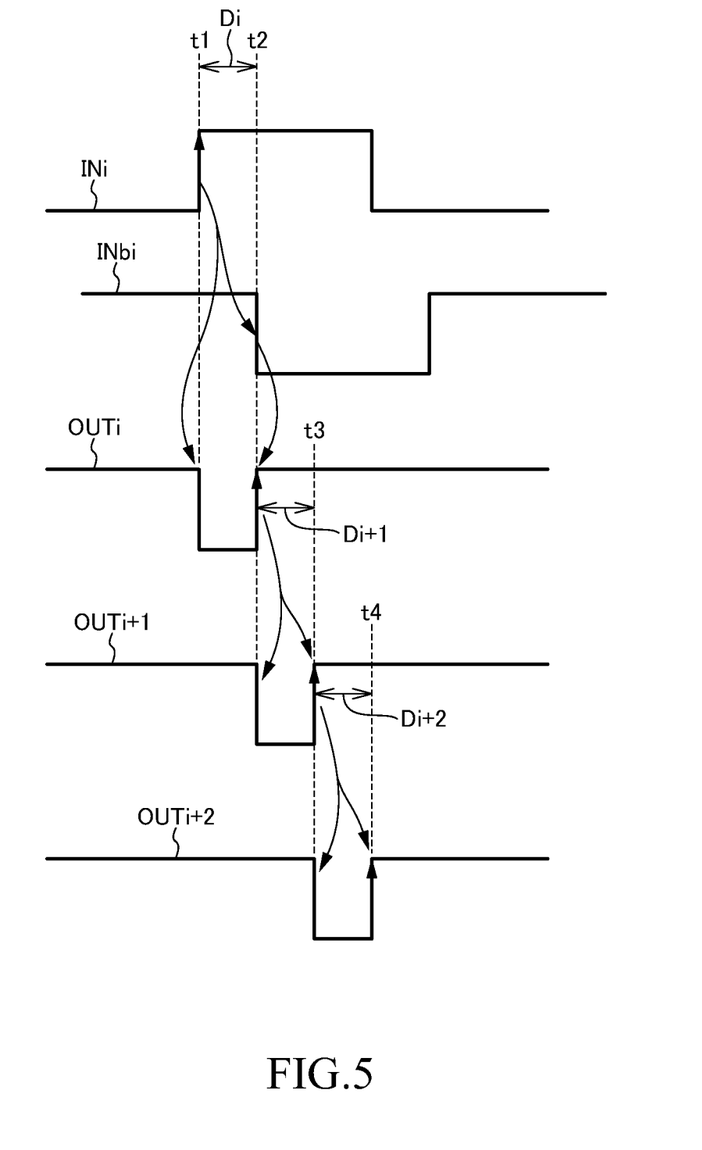
FIG. 5 is a timing diagram for explaining an operation of the one-shot pulse generation circuits 201 to 20n shown in FIG. 3.

Turning to FIG. 5, symbol INi indicates a waveform of the input clock signal IN supplied to an i-stage one-shot pulse generation circuit 20i, and symbol INbi indicates a waveform of the clock signal INb within the i-stage one-shot pulse generation circuit 20i. In an example shown in FIG. 5, a rising edge of the clock signal INi appears at a time t1, and a falling edge of the clock signal INbi appears at a time t2. This means that a time period Di from the time t1 to the time t2 corresponds to a delay amount of the variable delay circuit 211 if a delay time due to the inverter 212 is ignored.

The one-shot pulse generation circuit 20i outputs an output clock signal OUTi obtained by receiving the clock signals IN and INb, as the one-shot pulse that is at a low level in a time period from the time t1 to the time t2. A pulse width of the one-shot pulse corresponds to the time period Di. The output clock signal OUTi is used as an input clock signal INi+1 supplied to a next-stage one-shot pulse generation circuit 20(i+1). The next-stage one-shot pulse generation circuit 20(i+1) thereby outputs an output clock signal OUTi+1 as the one-shot pulse that is at a low level in a time period from the time t2 to a time t3. A pulse width of the one-shot pulse corresponds to a time period Di+1.

Furthermore, the output clock signal OUTi+1 is used as an input clock signal INi+2 supplied to a next-stage one-shot pulse generation circuit 20(i+2). The next-stage one-shot pulse generation circuit 20(i+2) thereby outputs an output clock signal OUTi+2 as the one-shot pulse that is at a low level in a time period from the time t3 to a time t4. A pulse width of the one-shot pulse corresponds to a time period Di+2.

In this way, as the internal clock signal RCLK0 propagates through the one-shot pulse generation circuits 201 to 20n, pulse positions of the one-shot pulses gradually shift. The pulse width of each one-shot pulse defines a shift amount of the one-shot pulse.

It is important that both the falling edge (starting edge) and the rising edge (end edge) of each of the generated one-shot pulses starts at a rising edge of the input clock signal IN. In other words, falling edges of the input clock signal IN are irrelevant to the waveform of the generated one-shot pulse. As a result, a time period from the rising edge (end edge) of the one-shot pulse to the falling edge (starting edge) of the next one-shot pulse is sufficiently secured. Accordingly, even if the pulse width of the one-shot pulse is set large, the pulse does not disappear. This feature is described later in detail.

Figure 6:
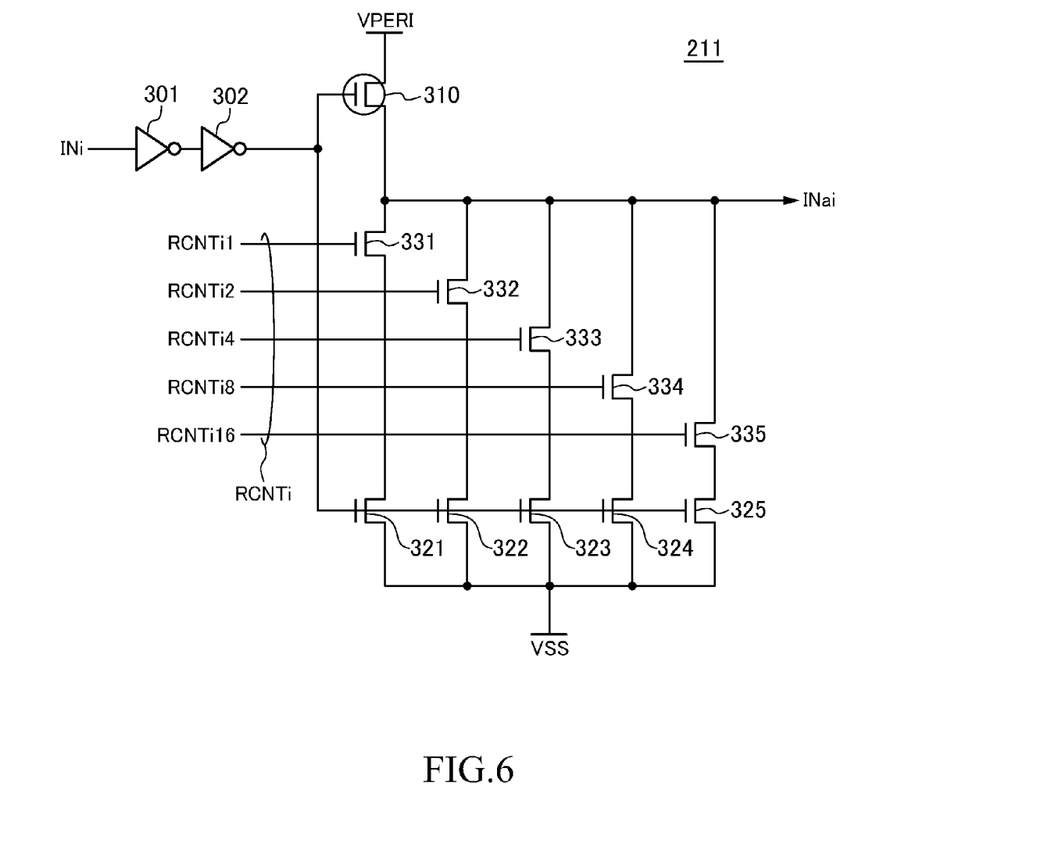
FIG. 6 is a circuit diagram indicative of an embodiment of the variable delay circuit 211 shown in FIG. 4.

Turning to FIG. 6, the variable delay circuit 211 includes two stages of inverters 301 and 302 that buffer the input clock signal INi, a P-channel MOS transistor 310 and N-channel MOS transistors 321 to 325 having gate electrodes that receive an output from the inverter 302, respectively, and N-channel MOS transistors 331 to 335 connected in series to the transistors 321 to 325, respectively. A source of the transistor 310 is connected to the high-potential-side power supply potential VPERI, and sources of the transistors 321 to 325 are connected to the low-potential-side power supply potential VSS. Furthermore, a drain of the transistor 310 and drains of the transistors 331 to 335 are commonly connected and function as an output node from which a clock signal INai is output.

Corresponding bits of a count value RCNTi are supplied to gate electrodes of the transistors 331 to 335 connected in parallel, respectively. In an example shown in FIG. 6, the count value RCNTi is constituted by a five-bit binary signal, and a least significant bit RCNTi1 is supplied to the gate electrode of the transistor 331. Similarly, a bit RCNTi2 is supplied to the gate electrode of the transistor 332, a bit RCNTi4 is supplied to the gate electrode of the transistor 333, a bit RCNTi8 is supplied to the gate electrode of the transistor 334, and a most significant bit RCNTi16 is supplied to the gate electrode of the transistor 335. In the present invention, the transistors 331 to 335 are often referred to as "driver circuits". The transistors 331 to 335 have different channel widths, which correspond to weights of the binary signal, respectively. That is, when the channel width of the transistor 331 is W, the channel widths of the transistors 332 to 335 are designed to be 2 W, 4 W, 8 W, and 16 W, respectively.

Driving capabilities of the respective transistors 331 to 335 are proportional to the channel widths, respectively. Accordingly, it is possible to adjust a speed at which the clock signal INai changes to a low level to 31 stages by selecting one or more transistors from the transistors 331 to 335. It suffices to set the count value RCNTi to a maximum value (set all the bits RCNTi1 to RCNTi16 to a high level) so as to change the clock signal INai to a low level at a highest speed. In this case, all current paths are effective. Furthermore, it suffices to set the count value RCNTi to a minimum value (set only the bit RCNTi1 to a high level and the other bits RCNTi2 to RCNTi16 to a low level) so as to change the clock signal INai to a low level at a lowest speed. In this case, only the current path constituted by the transistors 331 and 321 is effective.

Figure 7A:
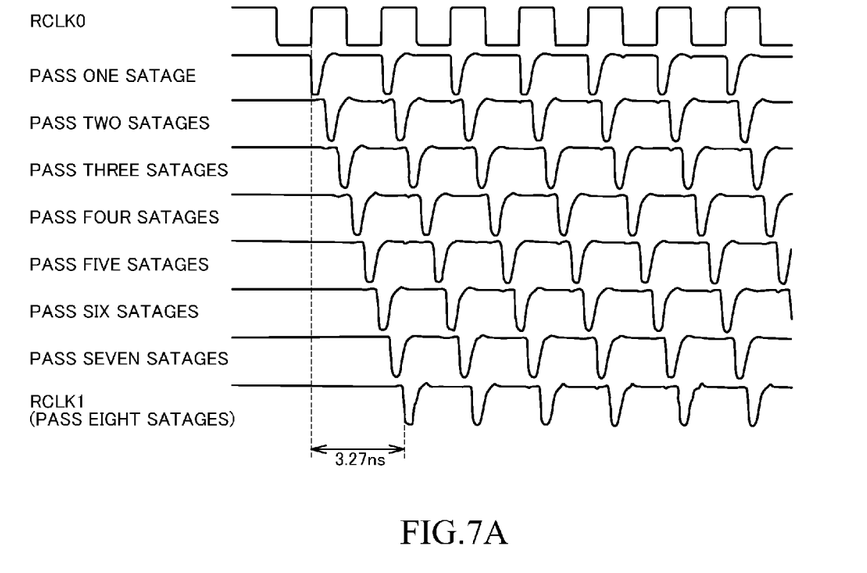
Figure 7B:
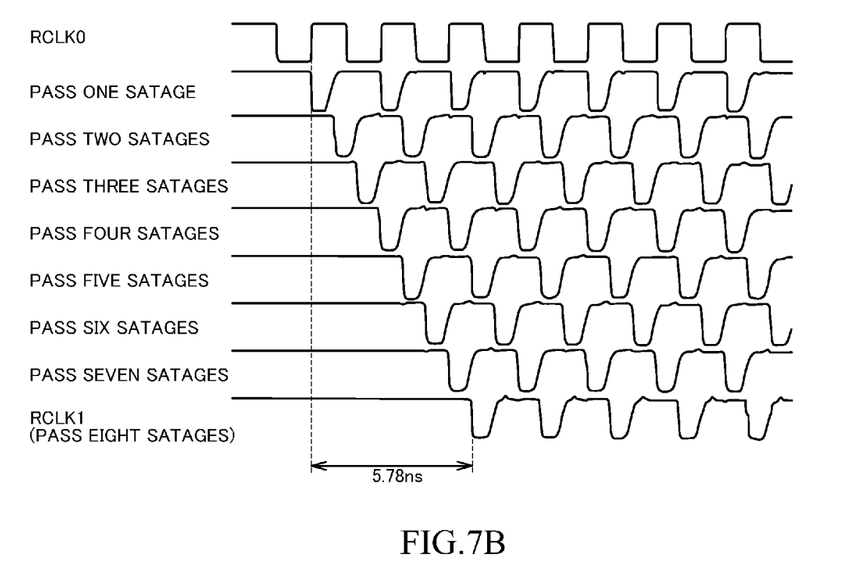

Turning to FIGS. 7A and 7B, a case where eight one-shot pulse generation circuits 201 to 208 constitute the delay line 110 is exemplarily shown.

As shown in FIG. 7A, when the delay amount is set to the minimum value, the pulse widths of the one-shot pulses output from the respective one-shot pulse generation circuits 201 to 208 are the smallest. Because these one-shot pulses propagate through the rear-stage one-shot pulse generation circuits, a delay in the finally obtained internal clock signal RCLK1 from the input internal clock signal RCLK0 is the minimum value. To make the delay amount the minimum value, it suffices to set the count value RCNTi supplied to each one-shot pulse generation circuit to the minimum value as described above. In an example shown in FIG. 7A, the obtained delay amount is 3.27 ns.

On the other hand, as shown in FIG. 7B, when the delay amount is set to the maximum value, the pulse widths of the one-shot pulses output from the respective one-shot pulse generation circuits 201 to 208 are the largest. Because these one-shot pulses propagate through the rear-stage one-shot pulse generation circuits, a delay in the finally obtained internal clock signal RCLK1 from the input internal clock signal RCLK0 is the maximum value. To make the delay amount the maximum value, it suffices to set the count value RCNTi supplied to each one-shot pulse generation circuit to the maximum value as described above. In an example shown in FIG. 7B, the obtained delay amount is 5.78 ns. That is, the delay amount increases by 2.51 ns from that in the example shown in FIG. 7A.

Needless to mention, by setting the count value RCNTi to various values, the delay amount can be adjusted to multiple stages in a range from the minimum value to the maximum value. It can be understood that the delay amount can be adjusted in a very wide range because the single one-shot pulse generation circuit $20i$ can make an adjustment to 31 stages. Furthermore, the adjustment pitch of the delay line 110 is very fine as compared with a general delay line constituted by an inverter chain.

While the delay line 110 has been described above, the same thing is true for the other delay line 120. Each of the internal clock signals RCLK1 and FCLK1 output from the delay lines 110 and 120 has a waveform of continuous one-shot pulses. The mixer circuit 130 extracts only the rising edges (or falling edges) of the internal clock signals RCLK1 and FCLK1 and combines the rising edges (or falling edges) thereof. As a result, it is possible to obtain the internal clock signal LCLK having a duty cycle that is coincident between edges of the external clock signals CK and CKB. The duty cycle may be equal to 50%.

As described above, according to the present embodiment, it is possible to make the adjustment pitch fine while securing the sufficiently wide adjustment ranges of the delay amount of the delay lines 110 and 120 by a simple circuit configuration. This makes it unnecessary to use both a coarse-adjustment delay circuit and a fine-adjustment delay circuit. Furthermore, there is no need to provide an analog-voltage generation circuit and a stabilization circuit for the analog-voltage generation circuit because an analog voltage is not used. This can simplify the circuit design.

Advantages of using the one-shot pulse generation circuits 201 to $20n$ in each of the delay lines 110 and 120 are described below.

Figure 8:
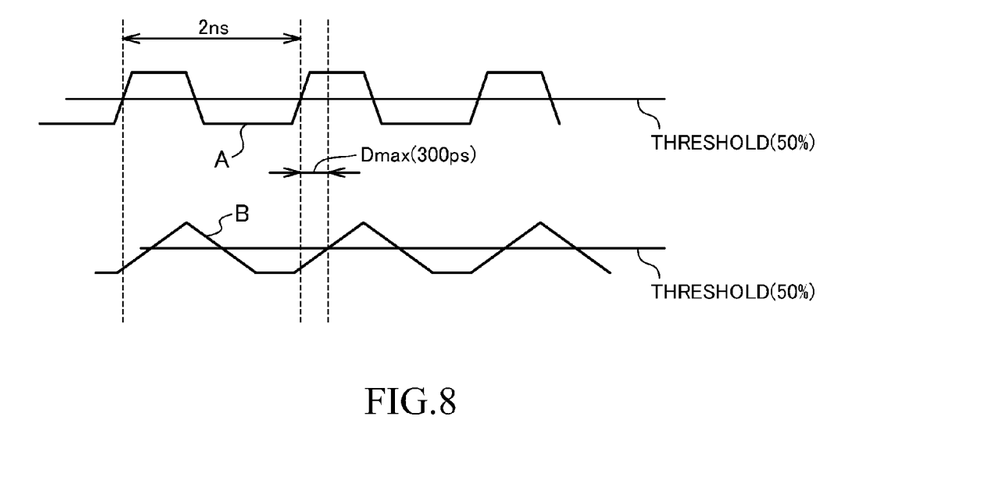
FIG. 8 is a timing diagram for explaining changes in waveforms in a case of using a general delay line, and the general delay line refers to a circuit that makes rising and falling edges of an input signal round.

Turning to FIG. 8, a signal A is a signal before the delay, and a signal B is a signal after the delay. As shown in FIG. 8, when both rising and falling edges of the signal A are made to be round, the signal B changes to have a triangular waveform. Accordingly, when the delay amount increases, that is, when rounding of rising and falling edges of the signal B increases, the pulses easily disappear. A maximum amount Dmax of the delay amount is limited in a range in which the pulses do not disappear. As an example, when it is assumed that a cycle of the signal A is 2 ns, a duty cycle of the signal A is 40%, a rising time and a falling time of the signal A are both 200 ps, and a threshold is a 50% level of amplitude, the maximum value Dmax of the delay amount is expressed as follows.

$$(2\text{ns} \times 40\% - 200\text{ps}) \times 50\% = 300\text{ps}$$

That is, it is required to set the delay amount to be equal to or smaller than 300 ps because the delay amount that exceeds 300 ps results in disappearance of the pulses.

Figure 9:
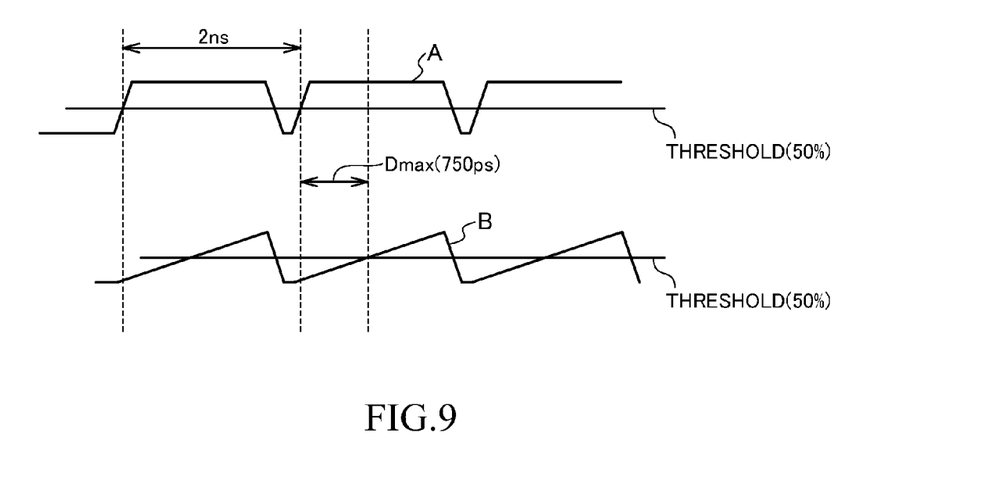
FIG. 9 is a timing diagram for explaining changes in waveform in a case of using the one-shot pulse generation circuit.

Turning to FIG. 9, a signal A is a signal before the delay, and a signal B is a signal after the delay. Because of the use of the one-shot pulse generation circuit $20i$, rising edges of the signal B are round as compared with those of the signal A, but falling edges of the signal B are substantially not round as compared with those of the signal A. Accordingly, the signal B has a saw-tooth waveform. In the present embodiment, similarly to the general delay line, the maximum value Dmax of the delay amount is limited in the range in which the pulses do not disappear. However, as an example, when is assumed that a cycle of the signal A is 2 ns, a rising time and a falling time of the signal A are both 200 ps, a threshold is a 50% level of amplitude, and a one-shot pulse width of the signal A is 100 ps, the maximum value Dmax of the delay amount is expressed as follows.

{2ns−(200ps+100ps)−200ps}×50%=750ps

That is, this means that, although the signal A shown in FIG. 8 has the same cycle as that of the signal A shown in FIG. 9, the maximum value Dmax of the delay amount can be extended to 750 ps by using the one-shot pulse generation circuit 20i.

Furthermore, this maximum value Dmax (=750 ps) is an amount per one-shot pulse generation circuit. Therefore, by connecting a plurality of one-shot pulse generation circuits 201 to 20n in series, a total delay amount is larger. Moreover, when the one-shot pulse generation circuits 201 to 20n are used, the duty cycle of the input signal has no influence on the maximum value Dmax of the delay amount, as is clear from the above mathematical formula. Therefore, even if the duty cycle of the input signal changes, the maximum value Dmax of the delay amount does not change.

A method of controlling the one-shot pulse generation circuits 201 to 20n by using the counter circuits 112 and 122 is not limited to a specific method. The one-shot pulse generation circuits 201 to 20n can be controlled so as to make the delay amounts of the one-shot pulse generation circuits 201 to 20n substantially uniform. Alternatively, the one-shot pulse generation circuits 201 to 20n can be controlled so as to change the delay amounts of the other one-shot pulse generation circuits when the delay amount of one one-shot pulse generation circuit reaches the maximum or minimum value. According to the former control method, rounding degrees of the pulses output from the one-shot pulse generation circuits 201 to 20n are substantially averaged, and thus a waveform having excessively rounded edges does not exist. As a result, it is possible to improve noise resistance. In contrast, according to the latter method, it is possible to simplify control.

Figure 10:
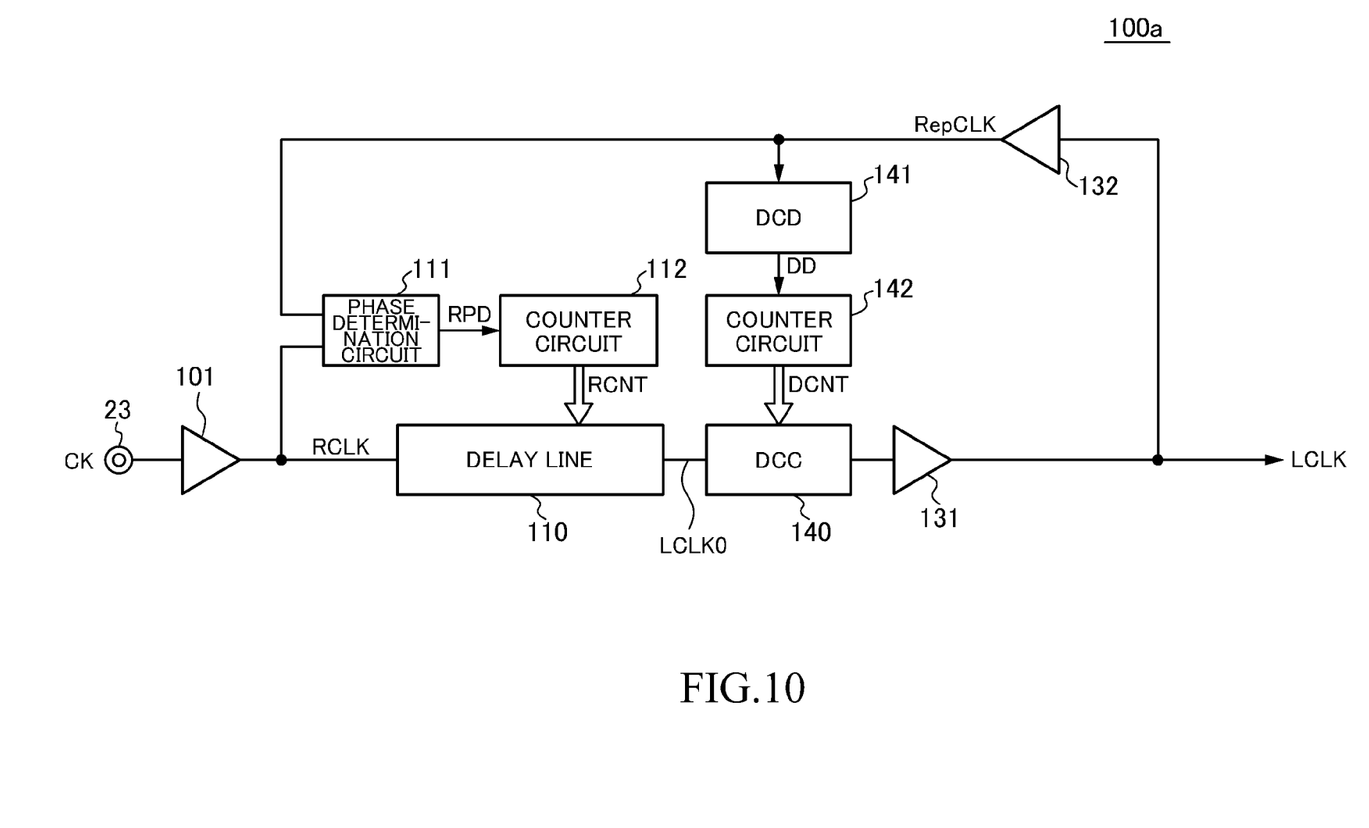
FIG. 10 is a circuit diagram indicative of an embodiment of a DLL circuit 100a according to a modification of the present embodiment.

Turning to FIG. 10, the DLL circuit 100a is not the two-phase DLL circuit but a DLL circuit of such a type as to adjust the falling edges of the internal clock signal LCLK using a DCC (duty-cycle correction circuit) 140. Similarly to the DLL circuit 100 shown in FIG. 2, the delay line 110 controls the rising edges of the internal clock signal LCLK.

In the DLL circuit 100a shown in FIG. 10, the replica clock signal RepCLK is also supplied to a DCD (duty-cycle detection circuit) 141. The DCD 141 is a circuit for detecting how much degree a duty cycle of the replica clock signal RepCLK deviates from 50% that is a target duty cycle. The DCD 141 supplies a duty-cycle determination signal DD that is a result of detection to a counter circuit 142. The counter circuit 142 counts up or counts down based on the duty-cycle determination signal DD, and the DCC 140 is controlled based on a count value DCNT of the counter circuit 142. The DCC 140 is a circuit that adjusts positions of the falling edges of the internal clock signal RCLK1 based on the count value DCNT. The feedback described above can stabilize a duty cycle of the internal clock signal LCLK to be 50%.

As long as the delay line 110 is configured as explained in the present embodiment in the DLL circuit 100a configured as described above, it is possible to achieve the same effects as those of the above embodiment. As described above, the internal clock signal RCLK1 output from the delay line 110 has the waveform of continuous one-shot pulses and a duty cycle of the internal clock signal RCLK1 greatly deviates from 50%. However, the DCC 140 corrects this deviation to 50%.

It is apparent that the present invention is not limited to the above embodiments, but may be modified and changed without departing from the scope and spirit of the invention.

For example, in the above embodiment, the transistors 331 to 335 that constitute the driver circuits are configured to have different driving capabilities by making the channel widths of the transistors 331 to 335 different. Alternatively, as another method of making the driving capabilities different, different channel lengths can be set to the transistors 331 to 335 or different fan-outs can be set to the transistors 331 to 335, respectively. In addition, it is not always essential to make the driving capabilities of the respective driver circuits different, and the same driving capability can be set to these driver circuits. Nevertheless, by making the driving capabilities of these driver circuits different (particularly by giving power-of-two weights to the respective driver circuits), it is possible to extend the adjustment range while ensuring a fine adjustment pitch.

What is claimed is:

1. A semiconductor device comprising:
an input node;
an output node; and
a plurality of one-shot pulse generation circuits connected in series between the input node and the output node, wherein
each of the one-shot pulse generation circuits receives an input clock signal supplied from the input node or another one of the one-shot pulse generation circuits previously connected thereto to output an output clock signal to the output node or another one of the one-shot pulse generation circuits subsequently connected thereto, both of a rising edge and a falling edge of the output clock signal being controlled based on one of a rising edge and a falling edge of the input clock signal, and a time period from one of the rising edge and the falling edge of the output clock signal to the other of the rising edge and the falling edge of the output clock signal being variable.

2. The semiconductor device as claimed in claim 1, wherein
each of the one-shot pulse generation circuits includes a variable delay circuit,
each of the one-shot pulse generation circuits specifies a timing of the one of the rising edge and the falling edge of the output clock signal based on the one of the rising edge and the falling edge of the input clock signal that has bypassed the variable delay circuit, and
each of the one-shot pulse generation circuits specifies a timing of the other of the rising edge and the falling edge of the output clock signal based on the one of the rising edge and the falling edge of the input clock signal that has passed through the variable delay circuit.

3. The semiconductor device as claimed in claim 2, wherein
the variable delay circuit includes a plurality of driver circuits connected in parallel, and
the time period is controlled by activating one or more driver circuits.

4. The semiconductor device as claimed in claim 3, wherein at least two of the driver circuits differ in driving capability.

5. The semiconductor device as claimed in claim 1, further comprising a duty-cycle correction circuit that adjusts a duty cycle of the output clock signal output from the output node to substantially 50%.

* * * * *